(12) United States Patent
Ruffieux et al.

(10) Patent No.: US 10,009,047 B2
(45) Date of Patent: Jun. 26, 2018

(54) DRIVER CIRCUIT FOR A PASSIVE RESONANT CIRCUIT, AND TRANSMITTER DEVICE

(71) Applicant: Melexis Technologies SA, Bevaix (CH)

(72) Inventors: Denis Ruffieux, Fribourg (CH); Emeric Pierre, Neuchâtel (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days. days.

(21) Appl. No.: 15/612,346

(22) Filed: Jun. 2, 2017

(65) Prior Publication Data

US 2017/0353197 A1    Dec. 7, 2017

(30) Foreign Application Priority Data

Jun. 7, 2016   (EP) .................................... 16173428

(51) Int. Cl.
| | |
|---|---|
| *H04B 1/04* | (2006.01) |
| *H04B 17/12* | (2015.01) |
| *H04L 27/04* | (2006.01) |
| *G06K 19/07* | (2006.01) |
| *H03K 7/02* | (2006.01) |
| *H01Q 9/04* | (2006.01) |

(52) U.S. Cl.
CPC ............ *H04B 1/04* (2013.01); *G06K 19/0723* (2013.01); *H03K 7/02* (2013.01); *H04B 17/12* (2015.01); *H04L 27/04* (2013.01); *H01Q 9/04* (2013.01)

(58) Field of Classification Search
CPC . H01Q 9/04; H04L 27/04; H04B 1/04; H04B 17/12; H04B 5/00
See application file for complete search history.

(56) References Cited

U.S. PATENT DOCUMENTS

| | | | |
|---|---|---|---|
| 6,317,027 B1 * | 11/2001 | Watkins | ............... G06K 7/0008 340/10.1 |
| 9,729,359 B1 * | 8/2017 | Muellner | .......... H04L 25/03834 |
| 2009/0153300 A1 | 6/2009 | Meier | |
| 2016/0019766 A1 * | 1/2016 | Padula | ............... G08B 13/2477 340/572.1 |

FOREIGN PATENT DOCUMENTS

| | | |
|---|---|---|
| EP | 1233371 A2 | 8/2002 |
| EP | 1233371 B1 | 12/2005 |
| EP | 2908271 A1 | 8/2015 |
| WO | 2014062709 A1 | 4/2014 |
| WO | 2016071312 A1 | 5/2016 |

OTHER PUBLICATIONS

European Search Report from EP Application No. 16173428.0, dated Nov. 10, 2016.

* cited by examiner

*Primary Examiner* — Jean B Corrielus
(74) *Attorney, Agent, or Firm* — Workman Nydegger

(57) ABSTRACT

A driver circuit for driving a passive resonant antenna-circuit, the latter comprising an inductance (L) and a capacitance (C) in parallel. The driver circuit comprises a first and a second interface node (Ni1, Ni2) connectable to the resonant antenna circuit, and comprises control circuitry for monitoring an oscillating voltage signal (Vosc) provided by the resonant antenna circuit, and for extracting timing information and amplitude information of said oscillating voltage signal (Vosc), and excitation circuitry for generating an excitation signal based on the measured timing and amplitude information, and for applying the excitation signal to the antenna circuit.

10 Claims, 12 Drawing Sheets

DRIVER CIRCUIT FOR A PASSIVE RESONANT CIRCUIT, AND TRANSMITTER DEVICE

FIELD OF THE INVENTION

The invention relates to the field of driver circuits, in particular to a driver circuit for a passive resonant circuit such as a parallel LC or parallel RLC circuit, and to a transmitter device containing such a driver circuit, and to a method of operating of such a driver circuit.

BACKGROUND OF THE INVENTION

Driver circuits for driving passive resonant circuits exist in the prior art. Passive resonant circuits can be for example: series LC circuits, parallel LC circuit, series RLC circuit, parallel RLC circuit, just to name a few. They can be used inter alia for transmission of a wireless signal.

WO2016071312(A1) describes a driver circuit and an active transmitter device, a series circuit consisting of a first capacitor and a second capacitor being charged to a reference voltage by way of a charging current and the charged capacitors being discharged via the inductor by an oscillating discharge, the discharge being terminated when the current through the inductor has completed an entire oscillation period or a multiple thereof.

There is always room for improvements or alternatives.

SUMMARY OF THE INVENTION

It is an object of embodiments of the present invention to provide a driver circuit for driving a resonant antenna circuit, and a transmitter device comprising such a driver circuit, and a method of driving a resonant antenna circuit using such a driver circuit, for example for driving a passive resonant parallel LC or RLC antenna circuit.

In particular, it is an object of such a driver circuit and transmitter device and method that they allow to drive the resonant antenna circuit in a manner in which the resonance frequency is very stable, and/or where the spectral behavior in terms of EMC spurious emissions is satisfying the legislated spectrum requirements, and/or where the driver circuit does not significantly increase the resistive losses of the resonant antenna circuit during continuous transmission, and/or wherein the energy efficiency is improved (as compared to systems where a frequency is imposed upon the resonant circuit, due to mismatch), and preferably two or more of these.

It is an object of particular embodiments of the present invention to provide such a driver circuit and transmitter device and method that allow to transmit an OOK-modulated bitstream (for example according to, but not limited to the norms ISO/IEC 18000-2 and 18047-2 related to TAG below 135 kHz).

It is an object of particular embodiments of the present invention to provide an integrated driver circuit capable of driving a plurality of resonant antenna circuits with fewer pins as compared to some prior art solutions.

These and other objectives are accomplished by a method and driver circuit and transmitter device according to embodiments of the present invention.

According to a first aspect, the present invention provides a driver circuit for driving a resonant antenna-circuit, the resonant antenna circuit comprising an inductance and a capacitance in parallel and being adapted for generating an oscillating voltage signal having a predefined oscillation frequency over a first and second node, the driver circuit comprising: a first and a second interface node connectable to the first respectively second node of the resonant antenna circuit; a control circuit being adapted for monitoring the oscillating voltage signal provided by the resonant antenna circuit on the first and second interface node, and for extracting timing information and amplitude information of said oscillating voltage signal, and for providing said timing and amplitude information to an excitation circuit; the excitation circuit being adapted for generating an excitation signal based on said timing information and said amplitude information, and for applying said excitation signal to the first and/or second interface node.

The excitation signal may be configured for starting oscillation of the resonance antenna circuit, or for maintaining oscillation of the resonance antenna circuit with substantially constant amplitude, or for stopping the oscillation.

It is an advantage of using a resonant antenna-circuit comprising an inductance and a capacitance connected in parallel, (as opposed to a driver circuit comprising the capacitance and a separate antenna-circuit comprising the inductance), because the driver circuit of the present invention allows the inductance to be directly connected to the capacitance, hence long wires between the L and the C can be avoided (as would be the case when the control circuit is located relatively far from the inductance, and the capacitance is part of the control circuit). It is furthermore an advantage that no switch is required between the driver circuit and the resonant circuit (or as part of the driver circuit but in series with the interface node), because such a switch always has an "RDSon" which inevitably leads to losses, and to a lower quality factor, and to a variation or deviation of the resonance frequency. In other words, the circuit of the present invention has the advantage that the quality factor of the oscillation frequency is increased, and resistive losses can be decreases.

It is a major advantage of using a resonant antenna-circuit comprising an inductance and a capacitance connected in parallel, (as opposed to a driver circuit comprising the capacitance), because the driver circuit of the present invention does not need to interrupt an ongoing oscillation of the resonant circuit by opening a switch between the inductance and the capacitance when recharging the capacitance. In contrast, in the circuit of the present invention, the oscillation is not interrupted, and an excitation signal is injected while the oscillation is continuing. This results in a more accurate or more stable resonance frequency, and creates less harmonics by avoiding such interruption.

It is an advantage of measuring a voltage provided by the antenna resonance circuit using the same nodes as the nodes where the excitation signal is injected, because only two nodes are required, in contrast to some prior art solutions, where at least three nodes are required. It is well known in the art of semiconductor industry that the number of pins is an important criterium for selection a package, and that the package cost of an integrated circuit increases with the number of pins. Thus, by requiring less pins, the package cost can be reduced, or for a given package, the number of antenna resonant circuits that can be connected can be increased, or the pin can be used for other functionality.

It is an advantage of a driver circuit according to the present invention that it allows to provide energy to the resonant circuit to compensate for energy losses. These losses need not be measured beforehand (e.g. during calibration), but are measured during operation, and by adjusting the excitation signal correspondingly, it is possible to provide the right amount of energy on the fly, in a manner which is robust to variations over time (temperature, aging, etc).

It is an advantage of a driver circuit according to the present invention that the energy efficiency is much improved as compared to systems where a frequency is imposed upon the resonant circuit, due to a frequency mismatch between the imposed frequency and the resonant frequency of the oscillator circuit. A small frequency mismatch can lead to large energy losses. By not imposing a frequency to the resonant circuit, typically a factor of about 4.0 to about 5.0 can be gained in energy efficiency, compared to circuit which do impose a frequency.

The driver circuit of the present invention is ideally suited for driving a passive resonant antenna circuit without the driver circuit needing to provide a capacitor to be connected in parallel to the inductance, which capacitor is moreover relatively large, and thus needs to be located outside of the circuit. Moreover, prior art circuits providing such as capacitor also provide a switch in series between the capacitor and antenna inductance, which requires pins, and which causes energy losses due to the electrical resistance (RDSon) of the switch.

Preferably, the resonant antenna circuit is a passive resonant antenna circuit.

In an embodiment, the passive resonant antenna circuit consists of only one inductance and only one capacitor, or consists of only one inductance and one or more capacitances in parallel with the inductance, and optionally one or more resistors.

In an embodiment, the control circuit is adapted for detecting a time of occurrence of a local minimum and/or a local maximum of the oscillating voltage signal.

In an embodiment, the control circuit is adapted for measuring an amplitude of the oscillating voltage signal.

In a preferred embodiment, the oscillating signal is sampled and optionally digitized at the moment of occurrence of a local minimum and/or a local maximum.

It is an advantage of measuring the amplitude of the oscillating voltage because it allows to accurately adjust the excitation signal (e.g. its amplitude or its frequency) so that an appropriate, e.g. the most appropriate amount of energy is provided to the resonant circuit.

In an embodiment, the excitation circuit comprises a current source, adapted for generating at least one current pulse.

In an embodiment, the at least one current pulse is a single pulse having an adjustable or selectable magnitude, chosen dependent on the measured amplitude of the oscillating voltage signal; or wherein the at least one current pulse is a plurality N of at least two or at least three pulses, each having a fixed magnitude or an adjustable magnitude; or wherein the at least one current pulse is a burst comprising a plurality N of pulses of a predefined magnitude, the number of pulses in the burst N being chosen dependent on the measured amplitude of the oscillating voltage signal.

In an embodiment, the driver circuit further comprises at least one voltage converter adapted for providing a positive voltage and/or a negative voltage; and the excitation circuit is adapted for generating an excitation signal comprising pulses with a positive and/or a negative sign using said positive and/or negative voltage.

It is an advantage of providing both a positive and a negative voltage, for example in the order of tenths of Volts, e.g. higher than 50 Vpp, because it allows to start an oscillation of the resonant circuit more quickly (pulses can be sent in both half-periods of the oscillating voltage), and/or to more accurately maintain an oscillation of the resonant circuit, and/or to stop an oscillation of the resonant circuit more quickly.

It is an advantage of using an excitation circuit capable of generating an excitation signal (e.g. containing one or more current pulses) selectively having a positive and a negative sign, because it allows to fully control (start, stop, maintain, increase amplitude, decrease amplitude) of the resonant circuit.

In an embodiment, the driver circuit further comprises a damping circuit adapted for damping the oscillating voltage signal; and the control circuit is further adapted for providing a damping control signal to said damping circuit.

It is an advantage of using a damper circuit (rather than letting the energy of the resonant circuit decrease by itself), because this allows to stop the oscillations more quickly, which is beneficial for OOK modulation with high quality factor antennas (e.g. Q larger than 15).

It is an advantage if the driver circuit is further adapted for starting activation of the damping circuit at a moment when the oscillating voltage crosses a predefined voltage level "Vp" approximately halfway the voltage swing.

In an embodiment, the driver circuit further comprises an input port adapted for receiving a binary input signal; and the control circuit is further adapted for generating the excitation control signal and the damping control signal based on said binary input signal.

It is an advantage of this driver circuit that it can drive the resonant antenna circuit so as to provide an OOK-modulated transmission signal, e.g. by starting oscillation at a rising edge of the binary bitstream, maintaining oscillation while the bitstream is high (e.g. '1'), actively damping the oscillation at a falling edge of the binary bitstream, and not controlling or actively damping the resonant circuit while the bitstream is low (e.g. '0').

According to a second aspect, the present invention provides an integrated circuit comprising at least one driver circuit according to the first aspect, having at least one first and at least one second pad or pin connectable to said resonant antenna circuit.

In a specific embodiment, the circuit would have exactly two interface pads or pins for each resonant antenna circuit to be driven.

In another specific embodiment, the circuit would have one common interface pin for a plurality of at least two resonant antenna circuits, and one additional pin for each individual of said at least two resonant antenna circuits. For example, the circuit may have exactly one first pad or pin which is commonly connected to the first node of a plurality of separate resonant antenna circuits, for example to six separate resonant antenna circuits, and would have exactly six additional, second pads or pins, each of which is connected to the second node of exactly one of said six separate resonant antenna circuits. This offers the advantage that only 7 pads or pins are required for interfacing with 6 individual resonant antenna circuits.

According to a third aspect, the present invention provides a transmitter device comprising: at least one passive resonant antenna circuit, each comprising an inductance and a capacitance in parallel and being adapted for providing an oscillating voltage signal over a first node and a second node of said antenna circuit; and a driver circuit according to the first aspect or an integrated circuit according the second aspect, connected to said at least one passive resonant antenna circuit.

According to a fourth aspect, the present invention provides a method of driving a resonant antenna-circuit, the resonant antenna circuit having a predefined resonance frequency and comprising an inductance and a capacitance in parallel and being adapted for generating an oscillating voltage signal on a first and second node of the resonant antenna circuit; the method comprising the steps of: a) monitoring the oscillating voltage signal provided by the resonant antenna circuit on the first and second node; b) extracting timing information and amplitude information of said oscillating voltage signal; c) generating an excitation signal based on the measured timing information and based on the measured amplitude information, and applying said excitation signal to the resonant antenna circuit.

In an embodiment, the method further comprises at least one of the following steps: d) detecting a local minimum and/or a local maximum of said oscillating voltage signal, and optionally defining a time window in the vicinity of the time of occurrence of the local minimum and/or the local maximum; e) measuring an amplitude of said oscillating voltage signal.

In an embodiment, the method further comprises: f) providing the excitation signal in the form of a single current pulse having a duration and/or an amplitude which is adjusted as a function of the measured amplitude of the oscillating voltage signal; or g) providing the excitation signal in the form of a burst comprising a number of current pulses having a fixed or adjustable duration and/or a fixed or adjustable amplitude and/or a fixed or adjustable sign and/or an adjustable delay between the pulses, where at least one of the number or the duration or the amplitude or the sign is adjusted as a function of the measured amplitude of the oscillating voltage signal.

It is an advantage of embodiments wherein the adjustable delay between the pulses is provided by a sigma-delta modulator.

According to a fifth aspect, the present invention provides a method of transmitting an OOK-modulated bitstream using a resonant antenna-circuit, the resonant antenna circuit having a predefined resonance frequency and comprising an inductance and a capacitance in parallel and being adapted for generating an oscillating voltage signal on a first and second node of the resonant antenna circuit; the method comprising the steps of: receiving a binary bitstream; determining a value or a transition of the bitstream; if a value of the bitstream is detected and the value is high, driving the resonant antenna circuit for maintaining a substantially constant amplitude of the oscillating voltage using a method according to the fourth aspect; and if a value of the bitstream is detected and the value is low, damping the oscillating voltage; and if a transition is detected, and the transition is a low-to-high transition sending one or more initial excitation pulses to the resonant antenna circuit, and subsequently driving the resonant antenna circuit for increasing the amplitude of the oscillating voltage using a method according to the fourth aspect; and if a transition is detected, and the transition is a high-to-low transition damping the oscillating voltage.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
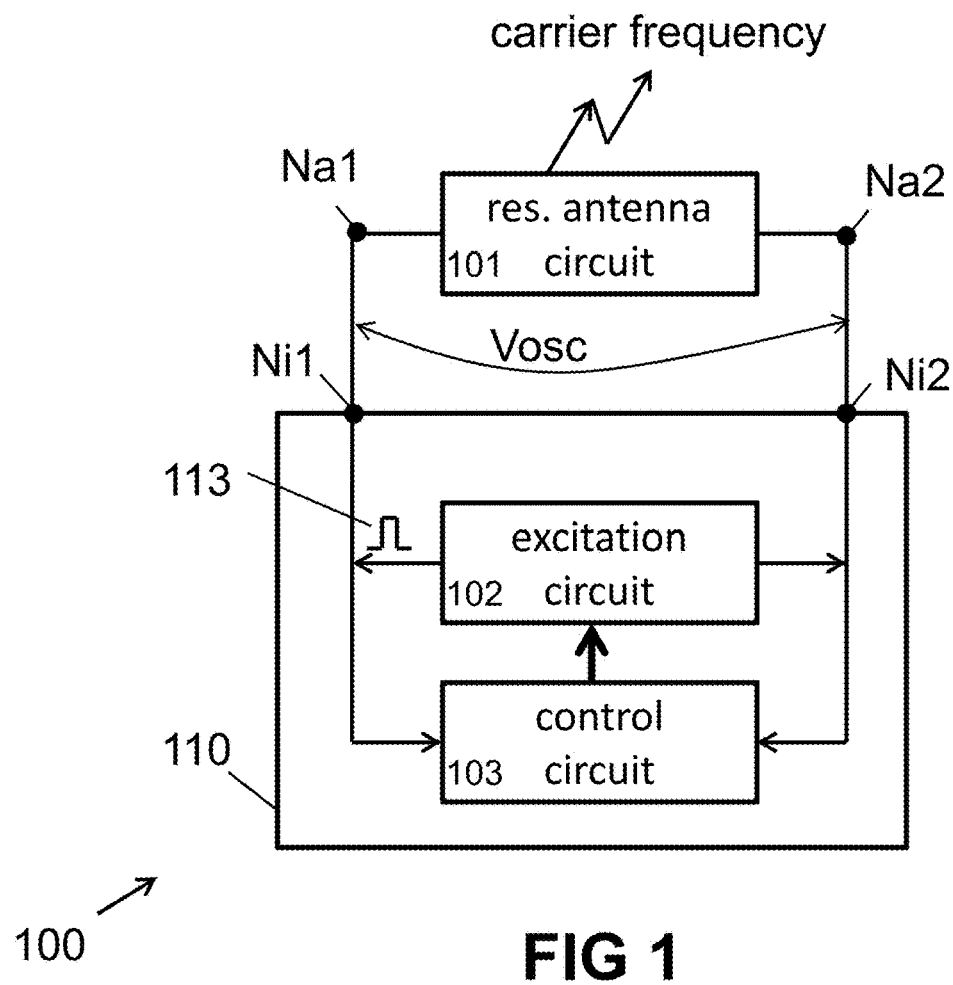
FIG. 1 shows a high level block diagram of a driver circuit and a transmitter device according to a first embodiment of the present invention.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the terms "excitation pulses" and "energizing pulses" are used a synonyms. In preferred embodiments of the present invention, the pulses are provided in the form of "current pulses".

The present invention relates to a driver Low-Frequency (LF) mechanism as can be used in Passive Entry (namely PEPS or PKE) applications, providing a high power drive signal (e.g. up to 4 App and 100 Vpp) to a resonant circuit such as, but not limited to a magnetic LC resonant circuit.

Passive Entry systems (PKE, PEPS) in the vehicle typically comprise a high-power low-frequency initiator together with an UHF sub-GHz receiver. A key, held by the user typically comprises a low-power 3-dimensional LF receiver together with a UHF sub-GHz transmitter.

FIG. 1 shows a high level block diagram of a transmitter device 100 comprising a driver circuit 110, and a resonant antenna circuit 101.

The resonant antenna circuit 101 has two nodes Na1 and Na2 over which it provides an oscillating voltage Vosc after being excited. The resonant antenna circuit 101 is preferably a passive circuit comprising an inductance L and a capacitor C connected in parallel. Such circuits are known in the art as a "parallel LC" or "parallel RLC"-circuit.

The driver circuit 110 of FIG. 1 has two interface nodes Ni1 and Ni2 connected to the nodes Na1 and Na2 of the antenna circuit 101. The driver circuit 110 contains a control circuit 103 adapted for measuring a characteristic of the oscillating voltage signal Vosc provided by the resonant antenna circuit 101, and for extracting timing information and amplitude information of said oscillating voltage signal Vosc. The timing and amplitude information is provided to an excitation circuit 102, also part of the driver circuit 110. The excitation circuit 102 is adapted for generating an excitation signal based on said timing information and based on said amplitude information, and is adapted for applying said excitation signal to the interface nodes Ni1, Ni2, and thus to the resonant antenna circuit 101.

Figure 2:
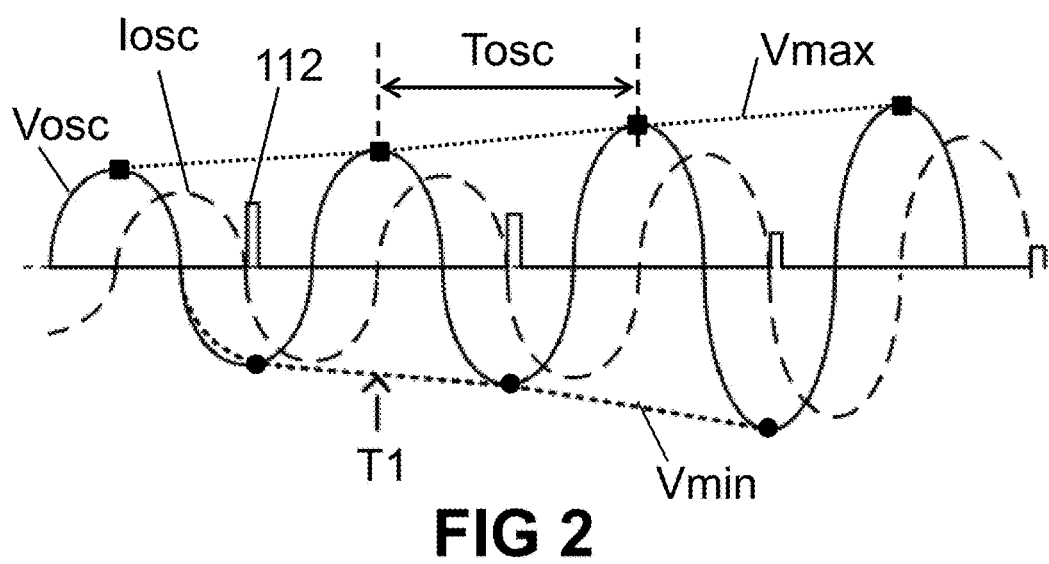
FIG. 2 shows an example of an oscillating voltage waveform and excitation pulses, as can be used/obtained in the circuit and device of FIG. 1.

The working of the transmitter device 100 can be understood from FIG. 2, showing a set of exemplary waveforms, including the oscillating voltage Vosc, and the current Iosc flowing inside the antenna circuit between the inductance L and the capacitance C (which is not explicitly used by the driver circuit, but shown for illustrative purposes). In embodiments of the present invention, the control circuit 103 determines time instances at which the oscillating voltage signal Vosc reaches a local minimum, as indicated by black dots. In FIG. 2 the black dots are interconnected via a dotted line Vmin for illustrative purposes. By comparing the amplitudes of these local minimum voltages, the control circuit can detect that the voltage swing of the oscillating voltage is increasing or decreasing, and can adjust the excitation circuit accordingly, e.g. for keeping the amplitude substantially constant.

The driver circuit 110 may also be adapted for detecting local maxima of the oscillating voltage signal Vosc, instead of, or in combination with the detection of local minima, as indicated by black squares. In FIG. 2 the local maxima are also connected via a dotted line Vmax for illustrative purposes.

As can be appreciated from FIG. 2, either the timing and amplitude of the local minima, or the timing and amplitude of the local maxima, or both can be used to determine the voltage swing of the oscillating voltage Vosc. When "starting" the resonant circuit, (see also FIG. 11) excitation pulses are provided to the resonant antenna circuit 101 in order to increase the oscillating voltage Vosc amplitude or voltage swing. In the present invention, the excitation pulse or pulses are provided during a time-window located in the vicinity of the local minima or maxima, the position of the window is determined for each oscillation of the oscillating voltage (further discussed in FIG. 10). Where in embodiments of the present invention a time window is located in the vicinity of a local maximum, it is located between the local minima which are neighbouring the local maximum. Where in embodiments of the present invention a time window is located in the vicinity of a local minimum, it is located between the local maxima which are neighbouring the local minimum. The time-window can for example be located shortly before, or shortly after or around these local maxima or local minima. When the time window is located shortly before a local maximum or minimum, the time between the end of the time window and the local minimum or maximum may for example be smaller than 30% or even smaller than 20% or even smaller than 10% or even smaller than 5% of the oscillating period Tosc. When the time window is located shortly after a local maximum or minimum, the time between the local minimum or maximum and the beginning of the time window may for example be smaller than 30% or even smaller than 20% or even smaller than 10% or even smaller than 5% of the oscillating period Tosc. In the examples shown in FIG. 10, the window is chosen to start slightly before the occurrence of the time window, and stops shortly after the local minimum is reached, but other solutions can also be used, for example, the time window may start at the position of the local minimum and have a predefined duration, e.g. determined by a local clock. In embodiments of the present invention, energizing pulses are preferably only provided in the time windows.

The time window during which energizing pulses are applied is preferably chosen smaller than 60%, or even smaller than 50%, or even smaller than 30%, or even smaller than 20% of the oscillating period Tosc.

It is a major advantage of the present invention that the exact start and duration of the time windows is not critical for the current application, and does not negatively influence the oscillation frequency, which is identical to the resonance frequency of the antenna circuit, because (during continuous transmission) the oscillation is not interrupted, in contrast to some prior art solutions.

The frequency of the oscillating voltage Vosc is primarily or almost exclusively determined by components L, C of the resonant antenna circuit 101, and only marginally by components of the driver circuit 110, because components of the driver circuit 110 are not connected in series between the L and C of the resonant circuit. The driver circuit 110 is designed such that it affects basically only the amplitude of the oscillating voltage Vosc and indirectly the current flowing through the resonant system, but does not significantly influence the oscillation period Tosc and thus the oscillation frequency Fosc=1/Tosc. Moreover, the driver circuit 110 does not actively participate to the losses of the resonant circuit 101, hence has no negative impact on the overall quality factor or losses of the resonant system.

According to an underlying principle of the present invention, the shape and/or size and/or number of the excitation pulses 112 (hence, the energy content of the pulses which will be injected into the resonant antenna circuit during the time window) is chosen dependent on the measured amplitude values of the oscillating voltage Vosc, e.g. as a function of the amplitude of the local minima or amplitude of the local maxima, or both.

The driver circuit 110 basically has 4 modes of operation:
   OFF, in which mode it does not provide energizing pulses to the antenna circuit,
   START, in which mode it provides energizing pulses, e.g. chosen to increase the voltage swing until it reaches a predefined level,
   ON, in which mode it provides energizing pulses chosen to keep the oscillating voltage amplitude as much as possible constant,
   STOP, in which mode it actively or passively decreases the oscillating voltage amplitude, for example by not sending any pulses (passively), or by sending "stopping pulses" (actively). Such stopping pulses may be sent outside of the above discussed time-window.

Figure 3:
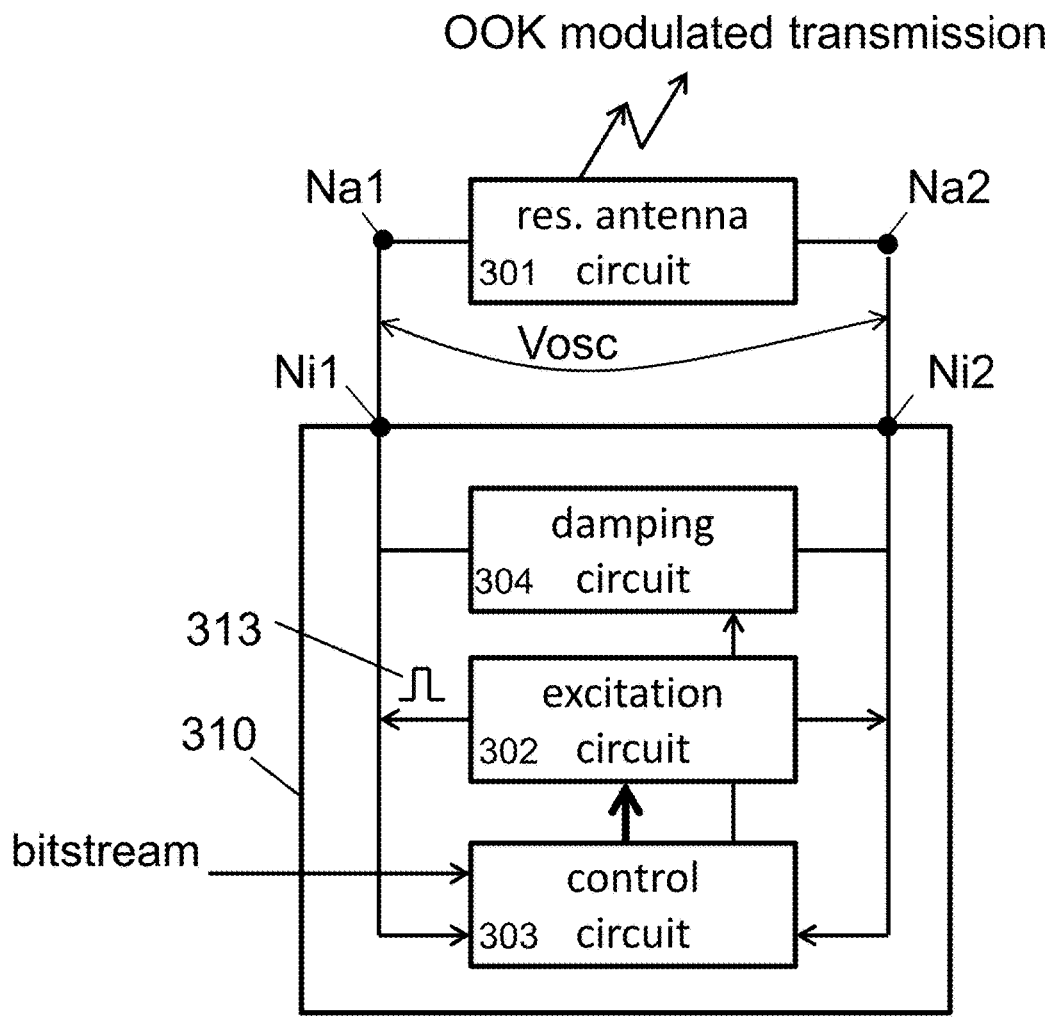
FIG. 3 shows a high level block diagram of a driver circuit and a transmitter device according to a second embodiment the present invention.

FIG. 3 shows a high level block diagram of a transmitter device 300 and driver circuit 310 according to a second embodiment the present invention, which can be seen as a variant of the transmitter device 100 and driver circuit 110 of FIG. 1.

While in the embodiment of FIG. 1 the time required for START and STOP was not important for the application (sending a carrier waveform), a fast START and a fast STOP is important for the device and circuit of FIG. 3. In addition to the blocks and functionality described above, the driver circuit 310 further comprises a damper circuit 304, which can for example be implemented by adding one or more resistors parallel to the antenna by means of a switch, for dissipating energy between the interfacing nodes Ni1 and Ni2, or by adding a capacitor parallel to the antenna, or by injecting anti-phase current pulses to the antenna circuit. It is noted that, in contrast to some prior art solutions, such switch is not connected in series between the L and C of the resonant circuit during normal operation, but only when the oscillation needs to be stopped.

Another difference between the device and circuit of FIG. 3 and that of FIG. 1 is that the driver circuit 310 has an input port for receiving a binary bit-stream (for example from a UART of an external processor).

The control circuit 303 is further adapted for fast changing from the mode OFF via START to ON, and for fast changing from mode ON via STOP to OFF, depending on the values of the bitstream to be transmitted. Preferably the duration of the START and STOP is as short as possible.

More specifically, in embodiments of the present invention, the "START" takes less than 5.0 periods of Tosc, e.g. less than 4.0 periods of Tosc, e.g. less than 3.0 periods of Tosc, e.g. less than 2.0 periods of Tosc, e.g. about 0.5 to about 1.5 periods of Tosc, meaning that after this time the amplitude of the oscillating voltage Vosc is increased from about zero to higher than 95% of its nominal value.

Likewise, in embodiments of the present invention, the "STOP" takes less than 5.0 periods of Tosc, e.g. less than 4.0 periods of Tosc, e.g. less than 3.0 periods of Tosc, e.g. less than 2.0 periods of Tosc, e.g. about 0.5 to about 1.5 periods of Tosc, meaning that after this time the amplitude of the oscillating voltage Vosc is decreased from its nominal value to less than 5% of its nominal value.

Using the same principles as discussed in relation to FIG. 2, namely, by monitoring oscillating voltage Vosc, and by detecting the time when the oscillating voltage reaches a local minimum or local maximum or both, and by measuring the amplitude of these maxima or minima, and by applying one or more excitation pulse(s) having a suitable size and/or shape and/or number in a time-window located around, or shortly before, or shortly after, or otherwise in the vicinity of these local extremes, it is possible to keep the amplitude of the oscillating voltage Vosc substantially constant, despite losses in the resonant antenna circuit.

Figure 4:
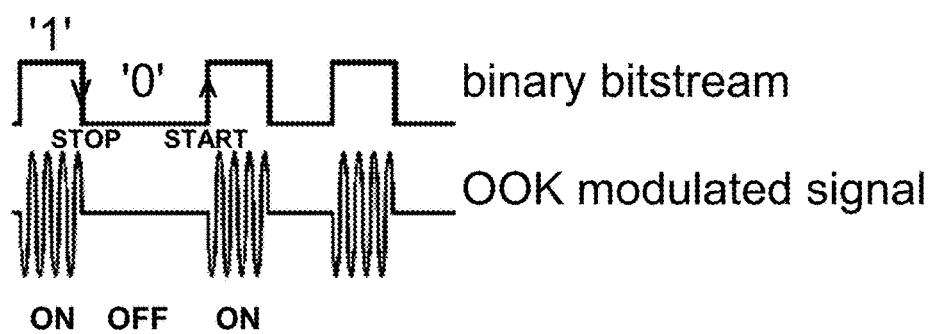
FIG. 4 shows exemplary waveforms of a binary bitstream and an OOK modulated signal as can be used/obtained in the circuit and device of FIG. 3.

FIG. 4 illustrates by way of an example (but the number of oscillations shown is much smaller than the number used in reality), how the driver circuit 310 of FIG. 4 can be used for transmitting an OOK-modulated signal (On-Off-Keying) as can be used for example in "Passive Entry applications", such as for example PEPS or PKE. The binary bitstream is typically provided by a microcontroller having a "UART", but the invention is not limited thereto, and the bitstream can also be provided in other ways, such as for example by a microcontroller using timer interrupts, or by programmable hardware or a state-machine running at a predefined clock, but that is not the main focus of the present invention.

In the example of FIG. 4, while the value of the binary bitstream is '1', the driver circuit is in mode ON for maintaining the oscillations of the resonant antenna circuit. At a falling edge of the binary bitstream, the driver circuit quickly stops the oscillations of the resonant antenna circuit, by going from mode STOP, and then goes to mode OFF. While the value of the binary bitstream is '0', the driver circuit is in mode OFF and may optionally suppress oscillations of the resonant antenna circuit. At the rising edge of the binary bitstream, the driver circuit quickly starts the oscillations of the resonant antenna circuit and then goes to mode ON.

Figure 5:
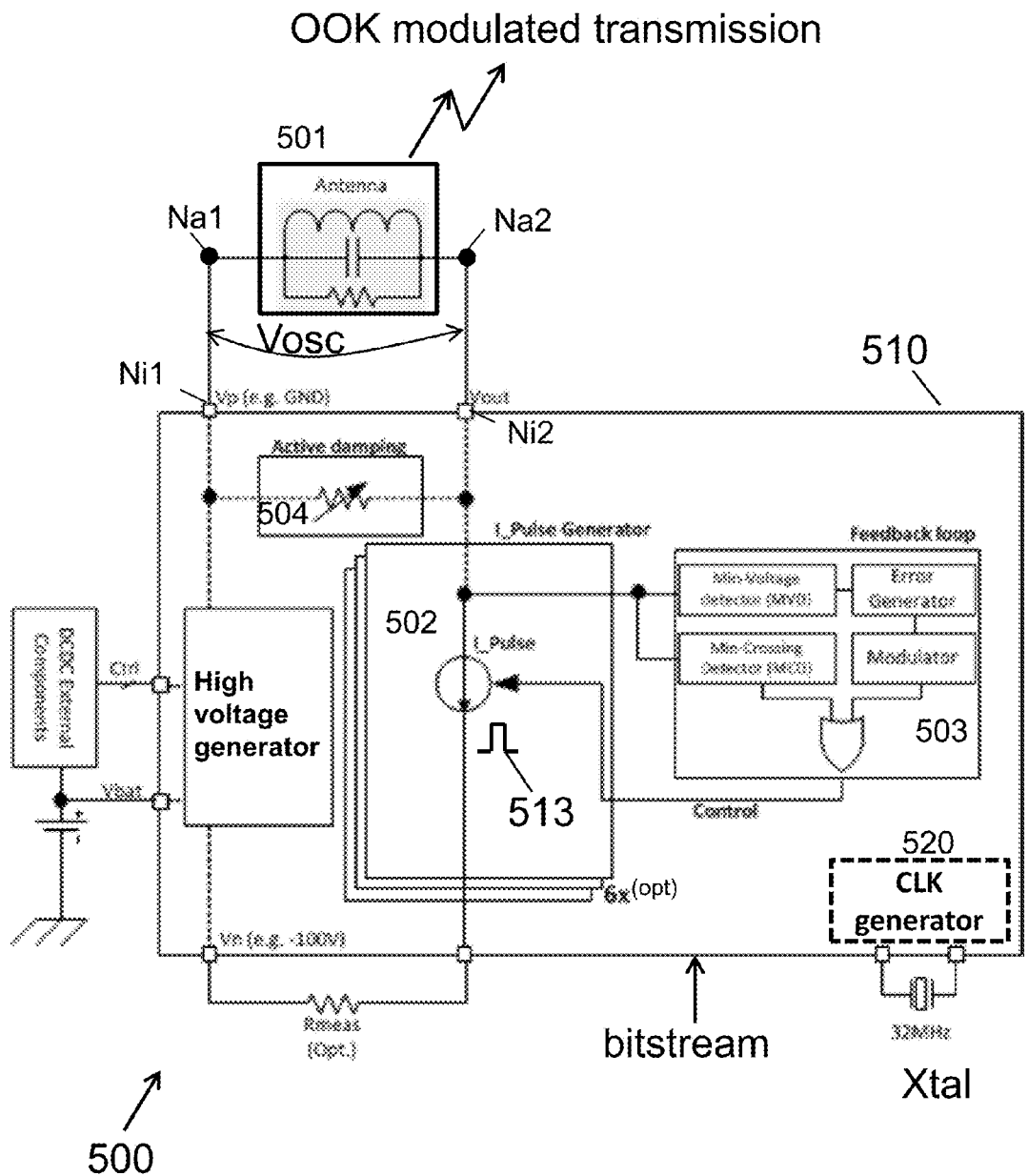
FIG. 5 shows a block diagram of a driver circuit and a transmitter device according to a third embodiment the present invention.

FIG. 5 shows a more detailed block-diagram of a transmitter device 500 and a driver circuit 510 according to a third embodiment the present invention. This driver circuit has the same functionality as the driver circuit 310 of FIG. 3, but in addition has one or more voltage generator circuits for providing one or more predefined DC voltages, for example a relatively large positive voltage Vp (e.g. up to about +100V) and/or a relatively large negative voltage Vn (e.g. up to about −100V). In a particular embodiment two voltage generators are present for generating both a positive and a negative DC voltage Vp, Vn at the same time. In alternative embodiments, these voltage supplies or voltage generators may also be located outside of the driver circuit itself.

In the embodiment of FIG. 5, the energizing pulses are current pulses generated by a current source "I_pulse", adapted for generating one or more current pulses during a given time-window. As described above, the energy content of the one or more current pulses, for example the shape and/or size and/or number of current pulses depends on the measured amplitude of the oscillating voltage Vosc.

Several options are possible, a few of which are listed here:
a) only a single pulse is sent per time window, the pulse having a predefined duration, but an adjustable amplitude depending on the measured amplitude of Vosc;
b) only a single pulse is sent per time window, the pulse having a predefined amplitude, but an adjustable duration depending on the measured amplitude of Vosc;
c) only a single pulse is sent per time window, the pulse having an adjustable amplitude and an adjustable duration, depending on the measured amplitude of Vosc;
d) a fixed predefined number of pulses is sent per time window, for example about 8 or about 16 or about 24 pulses. Each of these pulses may have a fixed duration and an adjustable amplitude, or a fixed amplitude and an adjustable duration, or an adjustable duration and adjustable amplitude, the adjusted time and/or amplitude depending on the measured amplitude of Vosc;
e) an adjustable number of pulses is sent per time window, the number of pulses being dependent on the measured amplitude of the oscillating voltage Vosc. The pulses may have a fixed duration and fixed amplitude, or a fixed amplitude and an adjustable duration, or a fixed duration and an adjustable amplitude, or an adjustable duration and an adjustable amplitude, the adjusted time and/or amplitude depending on the measured amplitude of Vosc;

In particular embodiments where both a positive and a negative energizing voltage Vp, Vn is available, both positive and/or negative current pulses may be provided. This may allow for an even faster START and/or STOP.

In the specific example shown in FIG. 5, the control block 503 may comprise one or more and preferably all of the following sub-blocks:
  a minimum-voltage detector (MVD) for detecting occurrences of local minima of the oscillating voltage Vosc,
  a minimum-crossing detector (MCD) for determining the time at which a local minimum voltage of Vosc is reached,
  an error generator for determining a difference between the measured voltage amplitude or voltage swing and the intended voltage, e.g. reference voltage or nominal voltage;
  a modulator, in particular an OOK modulator.

Depending on the measured amplitude of the oscillating voltage Vosc, the amplitude of the single current pulse may for example be selected as 1 out of 32 predefined amplitude values. The current pulses sent during a particular window may all have the same size and amplitude, but that is not required, and they may also have different amplitudes and/or size and/or duration and/or shape (e.g. rectangular, trapezoidal, triangular, Gaussian, or a combination hereof). Characteristics of the pulses, such as one or more of the pulse duration and/or the slope of the rising and/or the slope of the falling edge of the pulse may be dynamically adapted as a function of the measured amplitude of the oscillating voltage Vosc.

The current pulses may be derived from a local clock signal synchronized to the oscillating voltage Vosc using a PLL (phased locked loop). An advantage of this approach is that a local crystal oscillator can be avoided (reduced cost and/or reduced pin-count).

In another embodiment, the current pulses may be derived from a separate clock signal asynchronous to the oscillating voltage Vosc, as can be generated for example by a local crystal or a local crystal module. In the example shown, an external crystal of 32 MHz is used, but the invention is not limited thereto, and crystals or crystal modules of another frequency may also be used. An advantage of using an asynchronous clock for generating the timing at which the current pulses are sent is that the current pulses are not in synchronism (at micro-level) with the oscillating signal Vosc, which may create less sharp peaks, and thus may be better for EMC. For the envisioned applications, the frequency of the oscillating voltage fosc is typically in the order of 10 kHz to 250 kHz, and the frequency of the crystal is typically in the order of 10 MHz to 50 MHz, hence the ratio of the local clock frequency and the oscillating antenna frequency is typically a value in the range from 40 to 5000, e.g. in the range from 100 to 1000.

Figure 7:
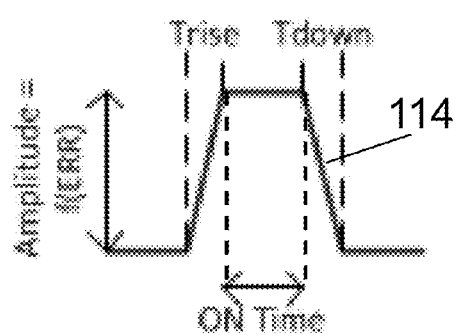
FIG. 7 shows an exemplary pulse shape as can be used in embodiments of the present invention.

The driver circuit 510 may optionally comprise further circuitry for further reducing the peak heights of the harmonics generated by the current pulses, by using spread spectrum techniques. One way of achieving this is by using a burst of pulses not all having the same "ON-time" (FIG. 7 shows what is meant by ON-time). By varying the ON-time, for example by modifying the duty-cycle of a center-aligned PWM signal, or by changing the alignment of the PWM-signal between for example left-aligned, mid-aligned and right-aligned, inside a single time-window, or between different time-windows, the peak heights of the spectrum may be further reduced.

A particular advantage of driver circuits according to the present invention is that they require only two pads or pins per resonant antenna circuit 501 that needs to be driven (only one being shown in FIG. 5), for example six resonant antenna circuits. In fact, if one of the pins of each resonant antenna circuit is connected to the first interface pin Ni1, then only six additional interface pins Ni2 are required for driving six resonant antenna circuits. Both of these implementations are believed to be an important advantage over the prior art, because pin count of an integrated chip is an important factor in the cost of such a chip. Of course, the number six is only an example, and the present invention is not limited thereto.

In a particularly interesting embodiment, the voltage supply or the voltage generator circuitry provides a negative drive voltage Vn, and the driver circuit 510 is connected to one or more resonant antenna circuits 501 by means of standard coaxial cables, where the ground potential is used as shield-voltage, and the high voltage drive signal is applied in the center of the coaxial cable. This allows good protection of the end-user.

Figure 6:
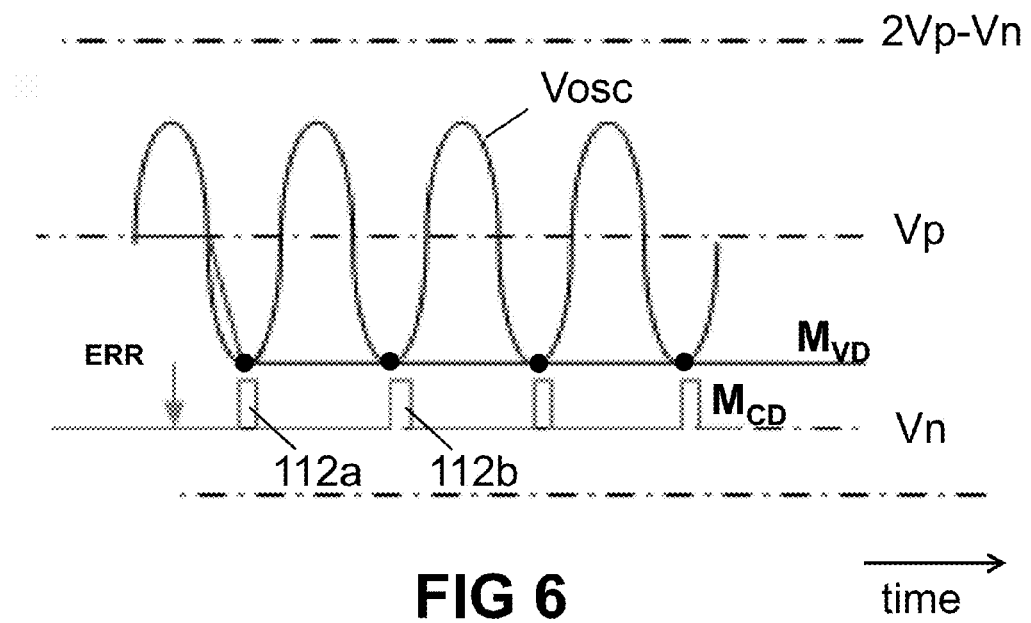
FIG. 6 shows an exemplary set of waveforms to explain some of the working principles of the block-diagram of FIG. 5.

FIG. 6 shows an exemplary set of waveforms to explain some of the principles of the block-diagram of FIG. 5. It shows in particular a positive voltage Vp and a negative voltage Vn, as may be supplied to the driver circuit 510 or generated by the one or more voltage generator circuits of the driver circuit 510.

As explained above, during the ON-mode, the pulses 112 are typically chosen such that the amplitude of the oscillating voltage Vosc remains substantially constant. In the example shown in FIG. 6, only a single pulse 112 is provided in each time window. The time-window itself is not shown, but is located at about the same time at which the oscillating voltage Vosc reaches a local minimum. The exact moment at which the current pulse is applied is not critical for the present invention.

An error signal ERR is also shown, which is defined in this example as the difference between the actual amplitude of Vosc and the desired amplitude of Vosc. This error signal ERR can be used to adjust the size and/or shape and/or number of current pulses in order to increase the amplitude of the oscillating voltage Vosc, as described above.

FIG. 7 shows an exemplary pulse shape as can be used in embodiments of the present invention. The current pulses may have a trapezoidal shape, as shown, comprising a rising edge with a predefined duration "Trize", a constant portion with a predefined duration "ON Time", and a falling edge with a predefined duration "Tdown".

The values of Trise, Tdown and Ton can be chosen to reduce, e.g. to minimize the generation of harmonics (EMC), either at design-time, or even dynamically during actual use of the device. In the example show, the pulse duration (ON time) is fixed, but the amplitude is adjusted as a function of the error signal ERR. The higher the error-signal, i.e. the higher the deviation from the envisioned amplitude, the larger the amplitude of the pulses. Any suitable function can be used, for example a proportional function, a linear function (=proportional+offset), a quadratic function, a staircase function, a piece-wise linear function (e.g. based on a look-up table), or any other suitable function. In the example shown in FIG. 6, a current pulse is injected at every rising edge of MCD (being the locations at which a local minimum was detected).

It is an advantage of using pulses having a trapezoidal shape because they generate less spurious signals in the frequency spectrum, which is advantageous for EMC reasons. But the present invention is not limited to only this pulse shape, and other pulse shapes can also be used, for example dome-shaped or sinusoidal-shaped or triangular pulses or Gaussian shape, or any other suitable shape, or some pulses may have a first shape (e.g. trapezoidal) and other pulses may have a second shape different from the first shape (e.g. triangular).

Figure 8:
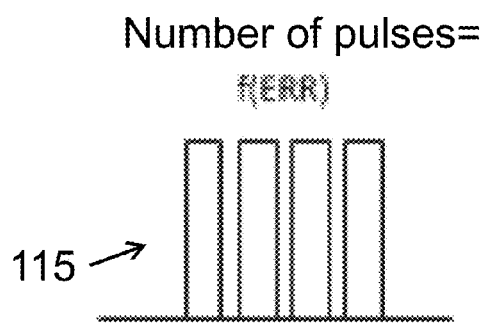
FIG. 8 shows an example of a burst or series of current pulses as can be used in embodiments of the present invention.

FIG. 8 shows another embodiment, where a plurality of pulses is used in each time window, rather than only a single pulse in each time window.

The duration and the size and the shape of each of these pulses may be predefined and fixed, but the number of pulses which are to be applied in each time window, are determined as a function of the error signal ERR. The larger the error signal (in absolute value), the higher the number of pulses that will be injected. The pulses are preferably applied in a small burst, inside the time window.

The shape of the pulses shown in FIG. 8 are rectangular, but other pulse shapes may also be used, for example trapezoidal, triangular, sinusoidal, or any other suitable shape. The pulses shown in FIG. 8 all have the same shape and size, but also that is not required, and the pulses may have different amplitudes and sizes.

In a particular variant of FIG. 8 (not shown), a maximum of for example 8 pulses are sent in each time window, the pulses having predefined relative amplitudes in powers of 2. Thus, the first pulse (which is sent or not) would have an amplitude of 128 units, the second pulse (which is sent or not) would have an amplitude of 64 units, etc. Whether a particular of these predefined pulses would actually be sent or not, would depend on the value of the measured amplitude of the oscillating voltage Vosc.

Figure 9:
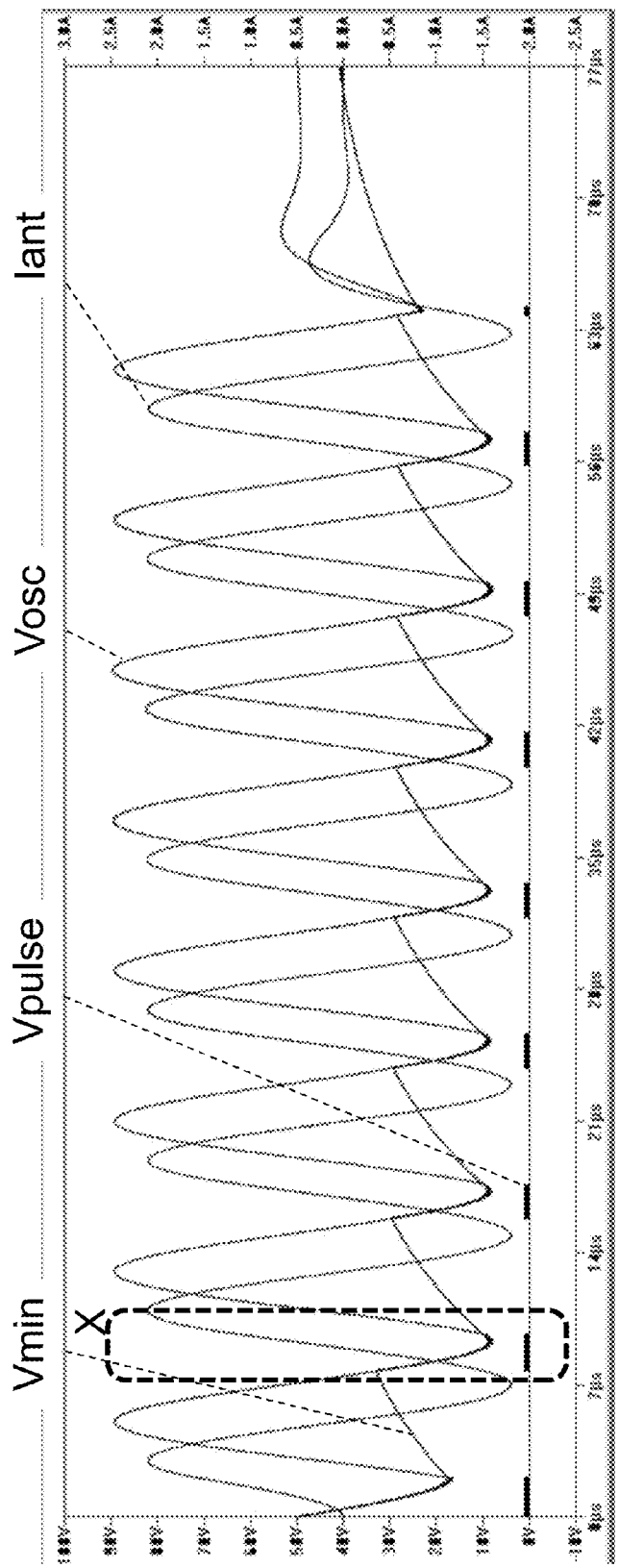
FIG. 9 shows an exemplary set of waveforms as can be used/obtained in the circuit of FIG. 5, during normal operation.

FIG. 9 shows an exemplary set of waveforms as may be used/obtained in the circuit of FIG. 5, during normal operation in the ON mode. Several signals are shown (see index on top of the Figure).

A first signal is called "Vmin", which in this example resembles a sawtooth waveform, because of the specific implementation. The idea is that Vmin tracks or "follows" the minimum value of Vosc, and when Vosc suddenly increases, Vmin slowly decays over time (typically with an RC constant). (see FIG. 11 for more details). Circuitry for making such a signal are known in the art, and may comprise for example a diode and a resistor R and a capacitor C and a comparator, but other circuits may also be used.

In the example shown, the time window for each local minimum starts when the signal "Vmin" crosses the signal "Vosc", (see FIG. 10 for more details), but the invention is not limited to this implementation, and other time windows can also be used.

Another signal is "Vpulse", appearing in FIG. 9 as thick black line segments, but actually being a burst of pulse signals, as will be discussed in more detail in FIG. 10.

Another signal is "Vosc", which is the voltage signal provided by the resonant antenna circuit 501.

As can be appreciated from FIG. 9, the oscillation is a sinusoidal signal having a highly stable frequency. The amplitude may vary, but is kept substantially constant by the driver circuit, thanks to the excitation pulses which provide the necessary energy for compensating radiated energy and losses in the antenna circuit.

Figure 10:
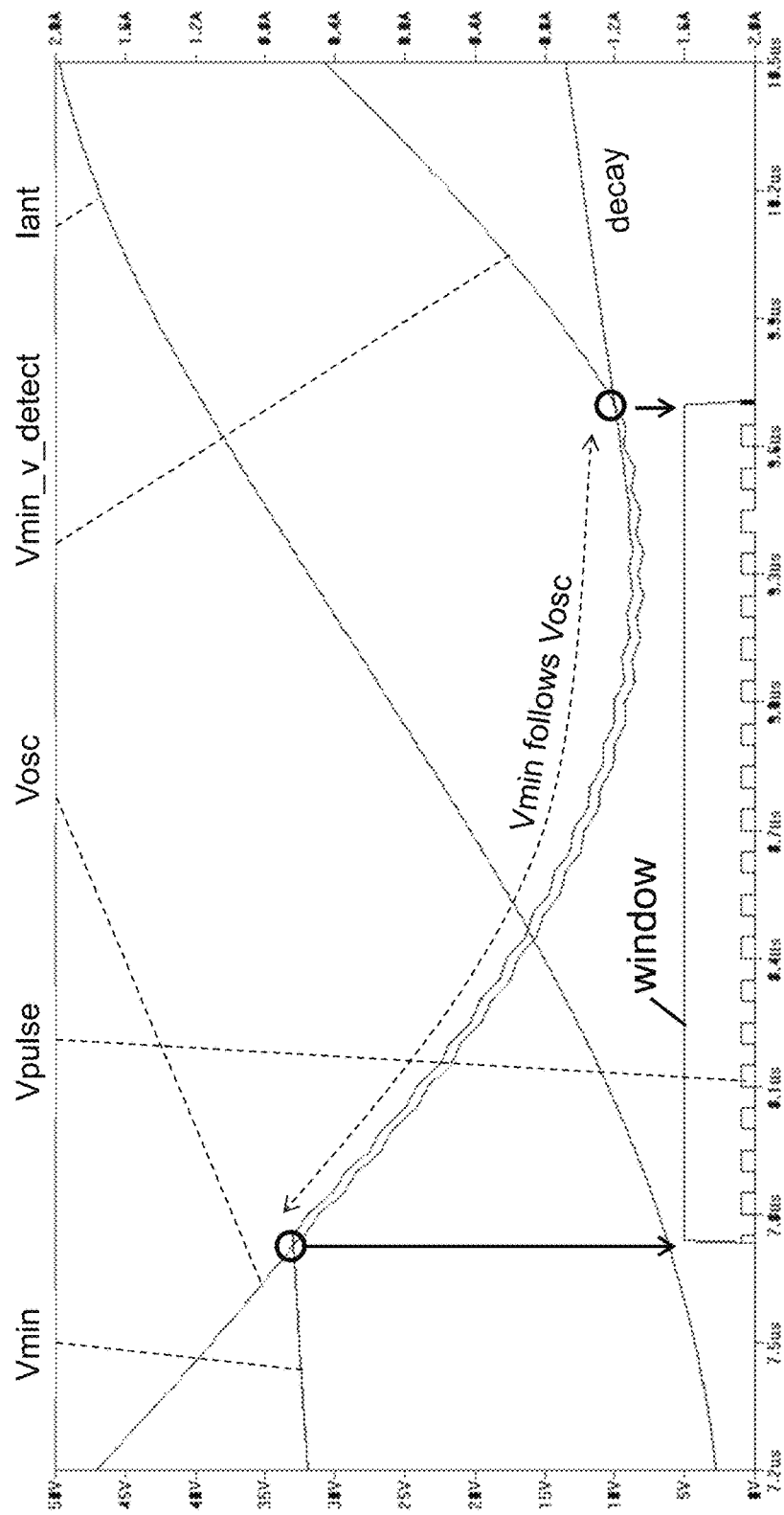
FIG. 10 shows some of the waveforms shown in FIG. 9 in enlarged view, including an example of a series of excitation pulses provided during a time-window located at, or in the vicinity of a local minimum of the oscillating voltage.

FIG. 10 shows some of the waveforms shown in FIG. 9 in enlarged view. In this example, the time-window stops at the moment when "Vosc" get larger than "Vmin", thus where the "Vmin" signal no longer follows the "Vosc"-curve, but decays.

At the bottom of FIG. 10 a sequence of control pulses are shown, which are subsequently used to generate the actual current pulse signals. Such control pulses can be generated by digital circuitry.

As already mentioned, the present invention is not limited to this specific implementation, and other time-windows can also be used.

Figure 11:
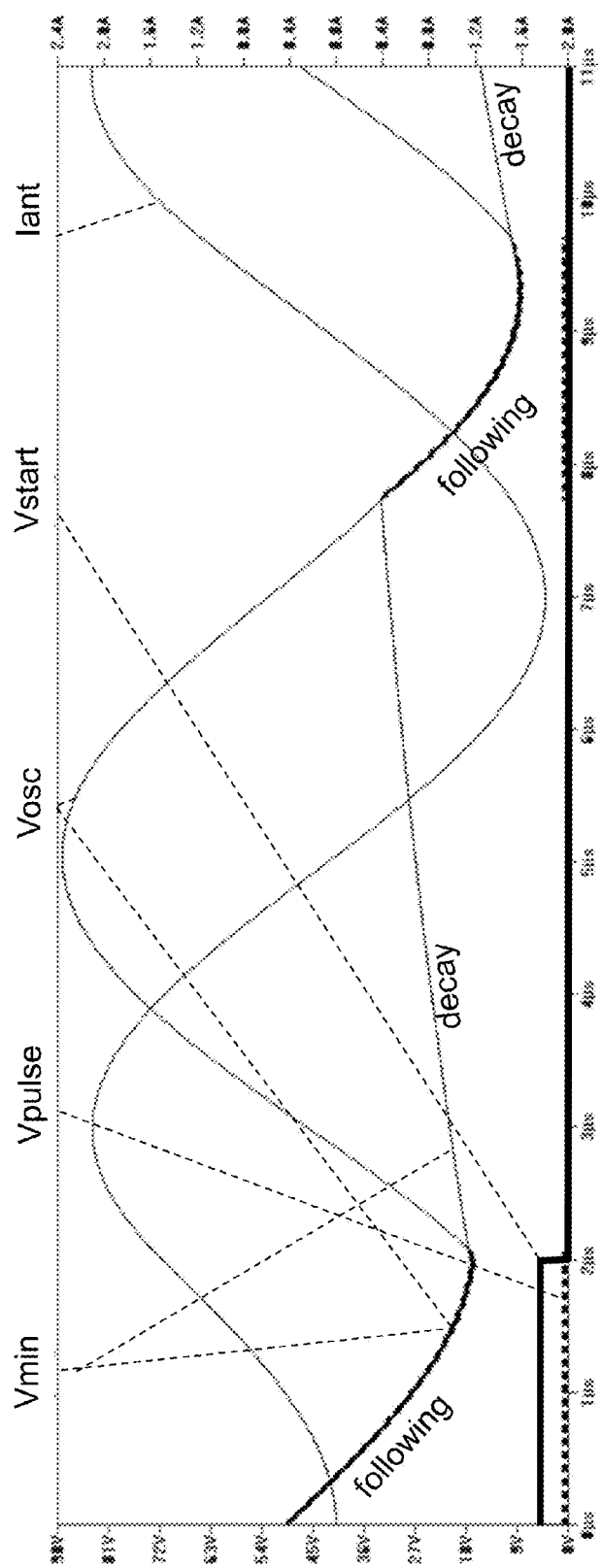
FIG. 11 shows an exemplary set of waveforms as can be used/obtained in the circuit of FIG. 5, during start.

FIG. 11 shows an exemplary set of waveforms as can be used/obtained in the circuit of FIG. 5, during START mode. After an initial pulse or burst of pulses (not shown), the antenna circuit starts to generate an oscillating voltage signal Vosc of a relative small value, but from that moment on, the drive circuit 510 uses the same mechanism as described also during the START mode, namely by monitoring the oscillating voltage signal, finding local minima and/or maxima, finding or choosing a suitable time-window, and providing one or more current pulses in said time window. However, during the start, the energy of the current pulses may be chosen larger than those required during the ON-mode, e.g. as large as possible, in order to get a faster start.

Figure 12:
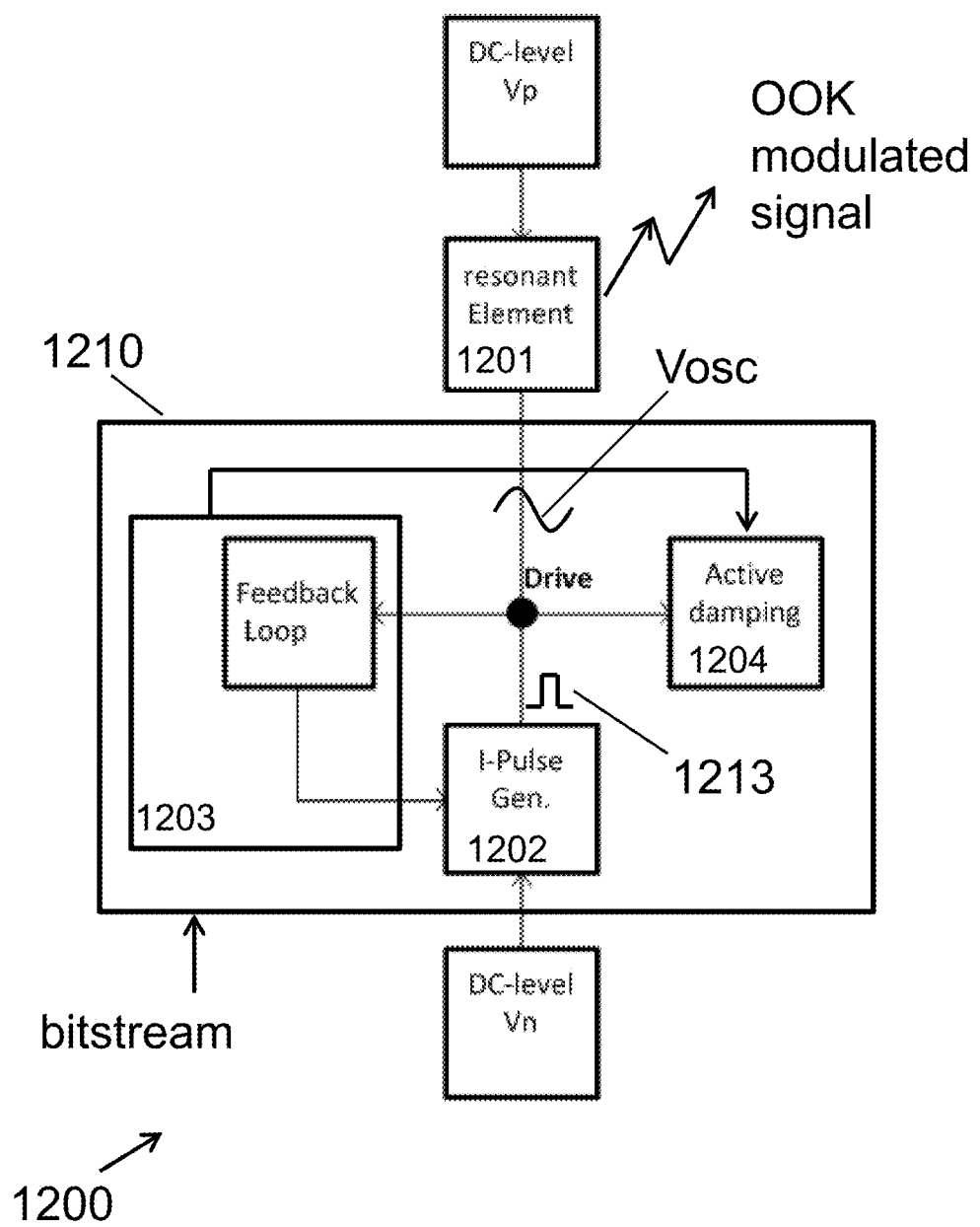
FIG. 12 shows another block-diagram of a driver circuit and a transmitter device according to an embodiment the present invention.

FIG. 12 shows another block-diagram of a transmitter device 1200 and a driver circuit 1210 according to an embodiment of the present invention. The functionality of this device 1200 and circuit 1210 is similar or identical to that shown in FIG. 3 and FIG. 5, but the voltage supplies Vp and Vn are explicitly shown. These voltages may be provided by external circuit (as shown), or may be provided by one or more voltage generators, which may be part of the driver circuit 1210.

It is contemplated that by using two independent relatively high-voltage generators, it is possible to invert the drive signal, e.g. using a negative voltage instead of the ground and the ground instead of the positive voltage. This may have advantages over providing two high voltages (e.g. in the order of +100V and −100V over a relatively long cable, e.g. longer than 1 m).

Figure 13:
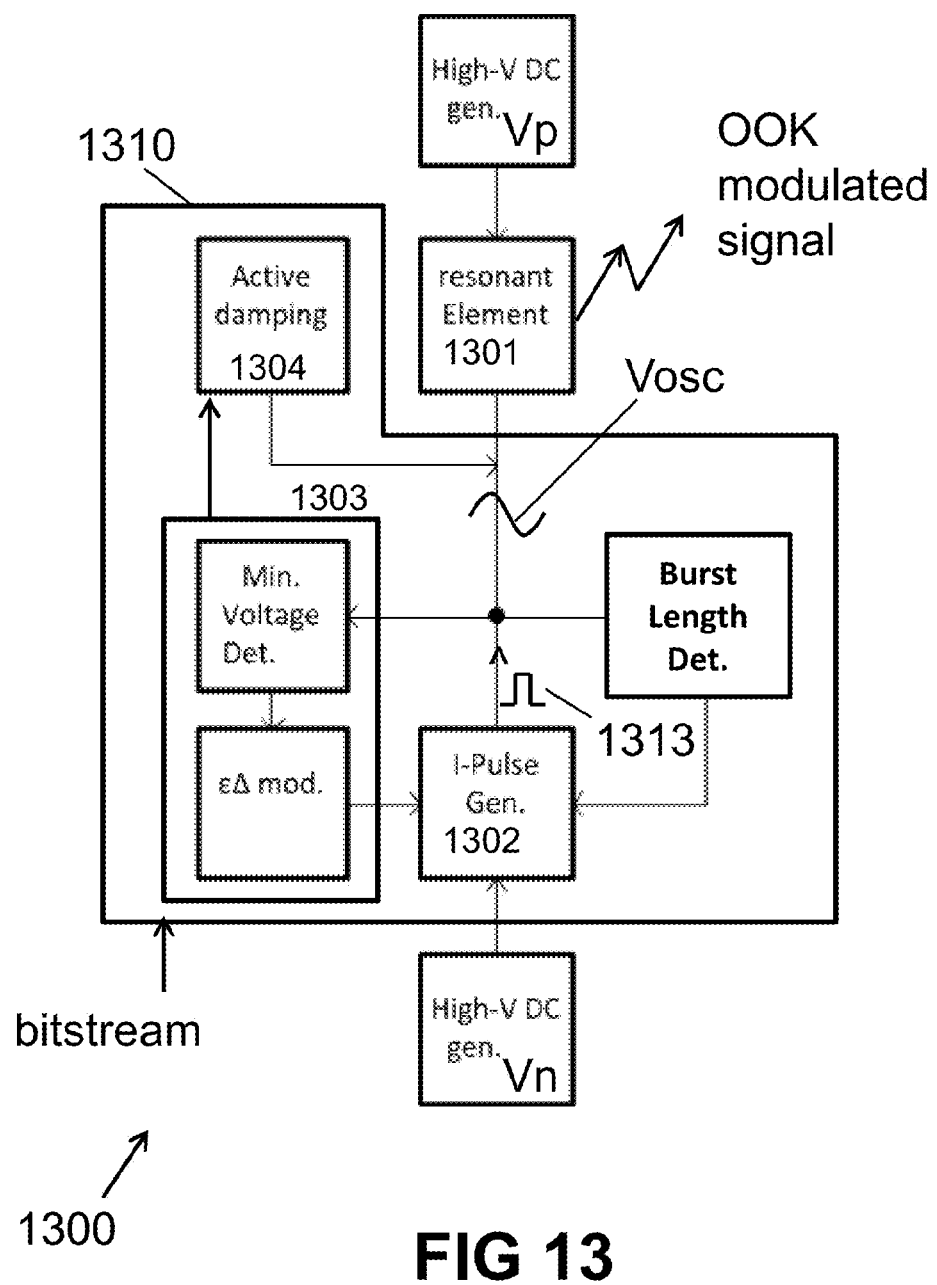
FIG. 13 shows another block-diagram of a driver circuit and a transmitter device according to an embodiment of the present invention.

FIG. 13 shows another block-diagram of a transmitter device 1300 and a driver circuit 1310 according to an embodiment of the present invention. This can be considered as a variant of the block-diagram shown in FIG. 12, with two main differences: a sigma-delta modulator, and a burst length determinator, both part of the control circuit 1310 (despite being shown as separate block). The purpose of the sigma-delta-modulator is to generate a burst of pulses having a predetermined "ON-time" (see FIG. 7) with a predefined time-interval in-between the pulses. The time between the pulses may be a fixed predetermined value, or may be variable and dependent on the measured amplitude of the oscillating voltage Vosc (as can e.g. be derived from the error signal ERR in FIG. 6) provided by the "error generator". The "Burst length determinator" determines the time during which the pulses are sent by the Sigma-Delta modulator, as a function of the measured amplitude of Vosc, as was described in relation to FIG. 8.

Figure 14:
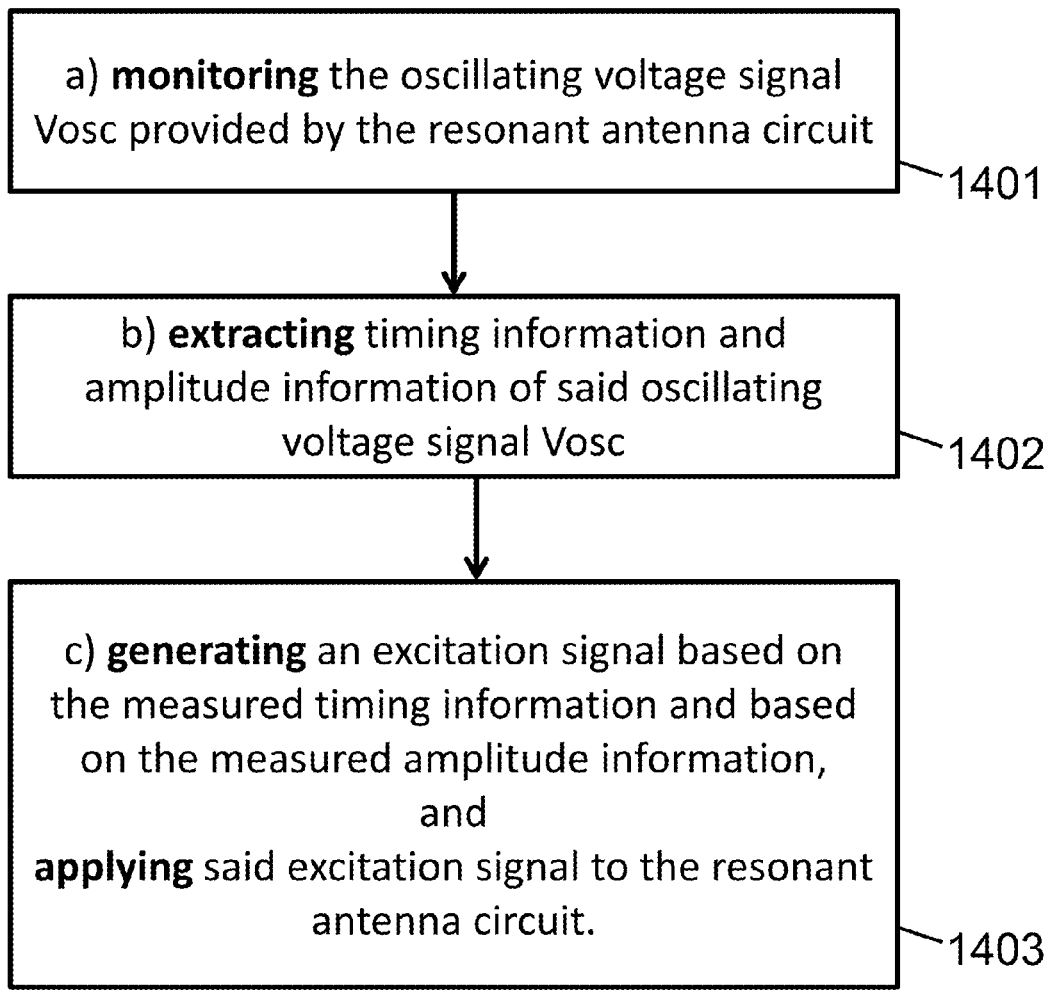
FIG. 14 shows a method of driving a resonant antenna circuit according to an embodiment of the present invention.

FIG. 14 shows a method of driving a resonant antenna circuit according to an embodiment of the present invention. The method comprises the steps of: a) monitoring 1401 the oscillating voltage signal Vosc provided by the resonant antenna circuit; b) extracting 1402 timing information and amplitude information of said oscillating voltage signal Vosc; c) generating 1403 an excitation signal based on the measured timing information and based on the measured amplitude information, and applying said excitation signal to the resonant antenna circuit.

Extracting timing information may comprise detecting local minima and/or local maxima of said oscillating voltage signal Vosc, and may comprise determining a time window located in the vicinity of these local minima or local maxima or both.

The method may further comprise measuring an amplitude of said oscillating voltage signal Vosc, and deriving an error signal therefrom, indicative for the amount of energy that needs to be injected in the resonant antenna circuit to maintain oscillation.

Step c) may comprise generating and providing the excitation signal in the form of a single current pulse or a series of current pulses for each time window. It is noted that the current pulses may have a positive sign or a negative sign.

Figure 15:
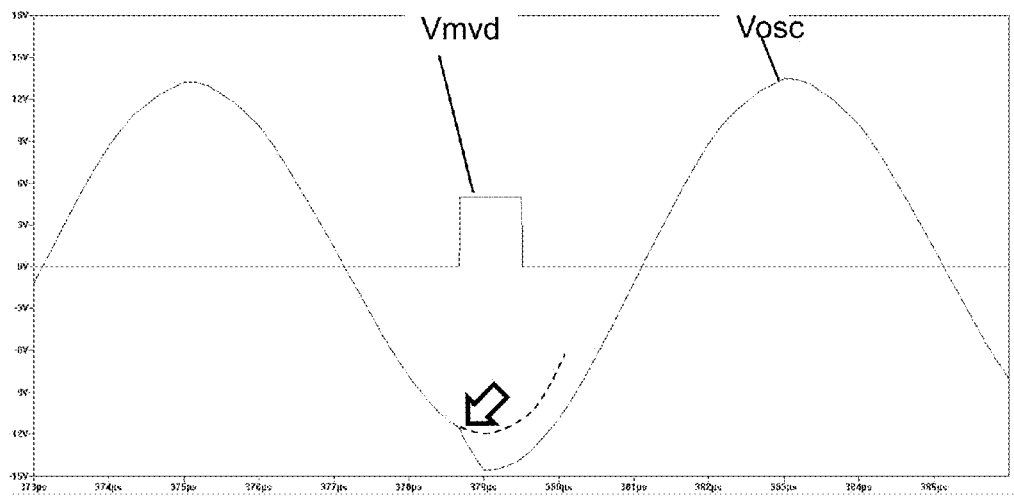
FIG. 15 shows an exemplary simulated waveform of the oscillating voltage in case a single (relatively large) current pulse is injected near a local minimum of the oscillating voltage.

FIG. 15 shows an exemplary simulated waveform of the oscillating voltage Vosc of the resonant antenna circuit versus time when a single (relatively large) current pulse is injected at a moment when the oscillating voltage would reach a local minimum.

The idea behind this example is the following: in order to keep the amplitude of the resonant circuit substantially constant, it was envisioned to "monitor" the oscillating voltage (e.g. by using the above mentioned circuit comprising a diode and RC and comparator), and at the moment when the oscillating voltage reaches a local minimum, to inject a single, relative large current pulse. It was found however that such a single relatively large current pulse causes an abrupt voltage change (i.e. amplitude distortion) of the oscillating voltage signal, which has a negative influence on EMC. It is noted in this respect that a single big current pulse is also provided in some prior art embodiments where a capacitor is (abruptly) recharged by a predefined voltage by means of closing a switch.

Looking for a way to reduce the impact of the current pulse on EMC, the inventors came to the idea of not using a single relatively large current pulse, but to use a plurality of relatively small current pulses with the same total energy content. But perhaps even more importantly, they came to the idea of starting the injection of the sequence of current pulses already before the local minimum voltage was reached, thus at a moment when the slope of the oscillating voltage waveform is not yet zero.

This is not a trivial choice, because the amount of energy to be injected depends on the amplitude decrease, which is not known until the minimum is actually reached. Furthermore, it is not trivial to implement, because it requires a "prediction circuit".

It was found however that the "minimum detector circuit" (also called above: "voltage monitor circuit") which was used before to find the "local minima" of the oscillating voltage Vosc could, after small modifications, also be used as a "predictor", namely by adding circuitry to detect the moment at which the decaying signal "Vmin" of the "minimum-detector circuit" crosses the oscillating voltage Vosc. It was found moreover that the same "minimum-detector circuit" could also conveniently be used to determine the end of the time-window, when defining the end of the time window as the time at which the oscillating voltage Vosc rises faster than the signal "Vmin" of the minimum detector circuit. Most of all, it turned out that the sequence of current pulses injected during this time-window caused a much smaller distortion of the oscillating voltage signal (as can be appreciated from FIG. 16), and had a much lower negative impact on EMC behavior.

Figure 16:
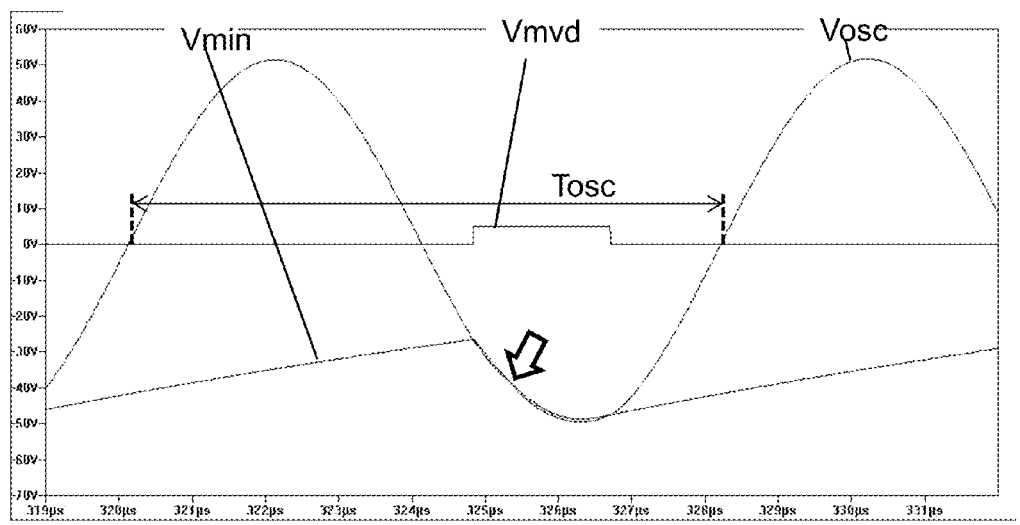
FIG. 16 shows an exemplary simulated waveform of the oscillating voltage in case a plurality of (relatively small) current pulses are injected during a time window which already starts before the minimum voltage is reached.

FIG. 16 shows an exemplary simulated waveform Vosc and the signal "Vmin" used to predict the start of the time window. The signal Vmvd can be generated by a comparator, and indicates the position of the window determined in the manner described here above. Thus, even though the time-window and the sequence of pulses distributed in said time window, as described above and illustrated in FIGS. 9, 10 and 11 is technically not the only possibility of energizing the resonant circuit, it was found to be particularly advantageous in terms of low complexity of the required circuitry, and in terms of EMC.

Figure 17:
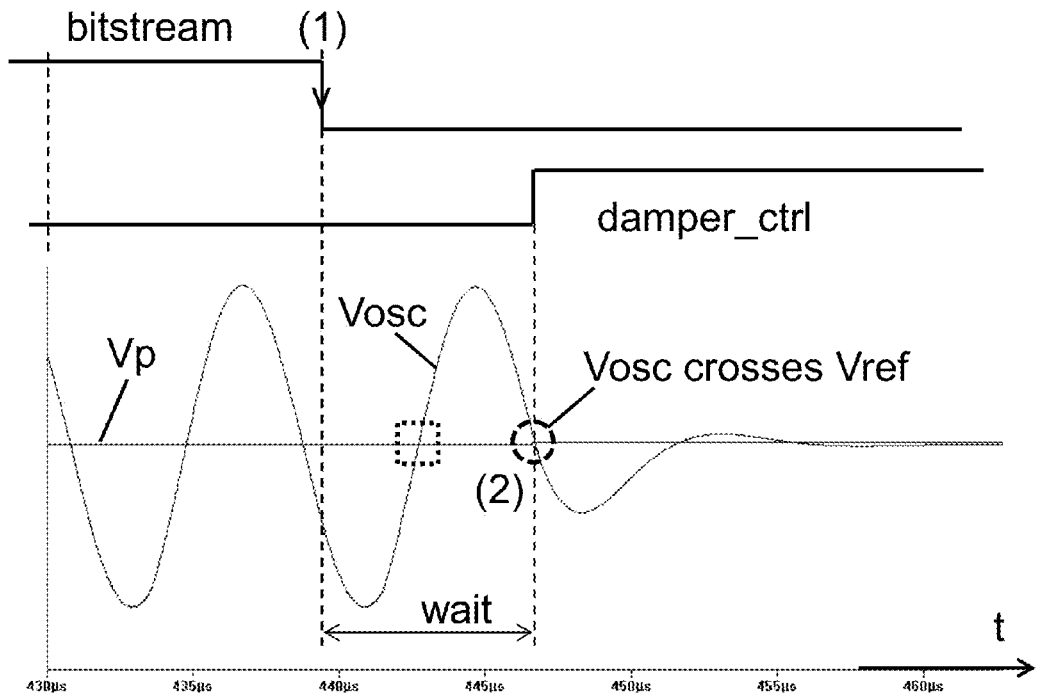
FIG. 17 illustrates a preferred timing of when to start damping.

FIG. 17 illustrates a preferred timing scheme of when to start damping. While not shown in FIG. 4, it was found that the spurious emissions of the transmitter device 300 shown in FIG. 3 can be highly improved by not damping the oscillating voltage signal Vosc immediately after detecting the falling edge of the (asynchronous) binary bitstream signal, but to deliberately wait until the oscillating voltage signal Vosc crosses the voltage level Vp. Additionally in order to guarantee a proper communication an integer number of oscillating cycles needs to be completed since the most recent START.

In the example of FIG. 17 it is assumed that the oscillation was started by pulling the oscillating voltage Vosc at the START "down" (using negative pulses). As can be seen in the drawing, some time after the falling edge of the bitstream (i.e. a transition from logic '1' to logic '0') has occurred, a first crossing of Vosc and Vp is indicated by the dotted square. However at this point the slope of Vosc is positive, hence N+½ oscillations are completed (N being an integer), therefore the two conditions are not satisfied and the damper is not yet activated. Some time later, as indicated by the dotted circle, another crossing of Vosc and Vp is encountered, at which point an integer number of periods is completed, and thus the two conditions are satisfied, and the damping circuit is activated.

Damping can be realized by discharging the voltage over the capacitance of the resonant antenna circuit, for example by connecting a resistance in parallel with the capacitance of the resonant circuit, which can for example be implemented by means of a switch in series with a resistor, or a switch in series with a diode, arranged between the interface nodes Ni1, Ni2. As can be seen in FIG. 17, the oscillation can be damped very fast, e.g. in the order of about 0.5 to about 1.5 oscillating period, for example about 1.0 oscillating period Tosc.

Waiting until both conditions described above are satisfied turned out to have only a minor impact on the maximum bitrate that can be transmitted by OOK modulation, but to offer important advantages in terms of EMC.

In an alternative embodiment where positive pulses are used instead of negative pulses, thus by pulling the oscillating voltage Vosc "up", an integer number of oscillations would be reached at a crossing of Vosc and Vp wherein the slope of Vosc (versus time) is positive.

Figure 18:
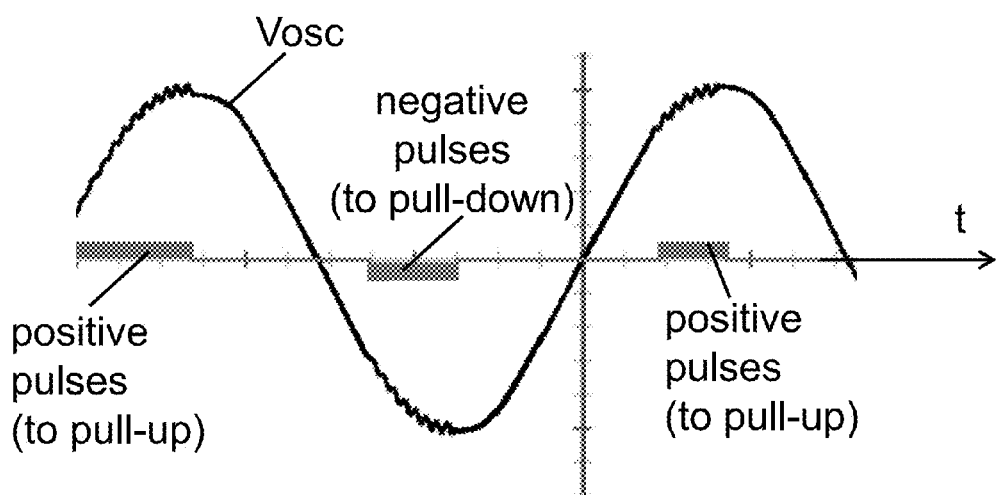
FIG. 18 shows an exemplary waveform where both positive and negative pulses are used.

FIG. 18 shows an exemplary waveform of the oscillating voltage signal Vosc, where both positive and negative pulses are used in a single circuit.

Referring back to FIG. 16, the example of FIG. 16 described how a signal burst comprising a number N of negative pulses was used to "pull-down" the oscillating voltage signal Vosc, e.g. to keep the oscillating amplitude substantially constant. As described above, these pulses are preferably applied in a time-window that starts slightly before reaching a local minimum of the oscillating voltage Vosc, and may stop for example at the moment when the local minimum voltage is reached. It was described that the start of the time window can be determined by a relatively simple circuit comprising a diode, a resistor R and a capacitor C and a comparator.

In a variant of FIG. 16 (not shown), instead of using negative pulses, the resonant circuit may also be energized by feeding it with positive pulses. In this case the "monitoring circuit" or "tracking circuit" would follow the rising of Vosc until it reaches a local maximum, but it would basically work according to the same principles.

As illustrated in FIG. 18, it is also possible to use both positive and negative pulses (i.e. pulses of different polarity) in a single driver circuit. The driver circuit would comprise two "tracking circuits", a first tracking circuit for determining a time-window preceding a local minimum of Vosc (as shown in FIG. 16) in which time-window a sequence of negative pulses is applied, and a second tracking circuit for determining a time-window preceding a local maximum of Vosc, in which time-window a sequence of positive pulses is applied.

Using both positive and negative pulses offers the advantage that the amplitude of the oscillating voltage Vosc can be adjusted in two time-windows per oscillating period Tosc instead of only one, and thus the energy supplied to the resonant circuit can be distributed even better, the amplitude of the oscillating voltage Vosc can be adjusted even more smoothly, resulting in an even better EMC behaviour.

For completeness it is noted that, instead of using only a single amplitude value for adjusting the size and/or amplitude and/or shape and/or number of the energizing pulses, it is also possible to use more than one single amplitude value, for example exactly two amplitude values (e.g. the immediately preceding local maximum and local minimum amplitude), but the invention is not limited thereto, and it is also possible to use more than only two amplitude values, for example in a PID-control loop. In this way the energizing of the resonant circuit can further be improved by avoiding abrupt changes of the amplitude, which may again further improve the EMC behavior.

SUMMARY

The present invention thus provides a driver circuit for driving a resonant antenna-circuit, e.g. a passive parallel LC or RLC circuit, the latter comprising at least an inductance and a capacitance in parallel.

The driver circuit comprises a first and a second interface node Ni1, Ni2 connectable to the resonant antenna circuit, and comprises circuitry adapted for monitoring an oscillating voltage signal provided by the resonant antenna circuit, and for extracting timing and amplitude information of said oscillating voltage signal Vosc, and for generating an excitation signal based on said timing and amplitude information, and for applying said excitation signal to the interface nodes. The excitation signal can be a single current pulse or (preferably) a series of current pulses. The pulse injection mechanism is chosen to mitigate the emissions of undesired harmonics by the overall system.

In contrast to prior art driver systems where an excitation frequency is imposed, or where the oscillating LC circuit is temporarily broken, or where components (e.g. capacitors, on-resistance of a transistor) are connected in series with the inductance, the driver circuit of the present invention allows the resonant antenna circuit to resonate as much as possible at its own characteristic frequency (determined by the value of L and C), without interruption each oscillation period, and synchronizes (at macro level) its operation (e.g. the dynamic positioning of the time windows in which excitation pulses are injected) to that resonance frequency. In this way the excitation signals are tuned with the frequency of the resonant circuit, avoiding power losses due to antenna miss-tuning.

In particular embodiments of the present invention, an "active damping" mechanism is also used, which is particularly useful to provide a fast ramp-up/down of the oscillation voltage Vosc. This allows to implement an On-Off Keying (OOK) modulation scheme, with a bitrate of for example about 2 kbps, or about 4 kbps or about 8 kbps or about 16 kbps.

An integrated driver circuit is proposed with a high level of integration and with a small, e.g. minimum number of connections (e.g. interface pins) to drive one resonant antenna circuit, or to simultaneously drive a plurality of resonant antenna circuits.

In targeted applications, although the present invention is not limited thereto,
- the antenna current can be higher than 2 App, e.g. up to 4 App,
- the antenna voltage can be higher than 40 Vpp, e.g. up to about 200 Vpp,
- the antenna Q-factor can be higher than 10, preferably higher than 20, or even higher,
- loss of power is avoided due to antenna mistuning, by allowing to the antenna circuit to oscillate at its own resonance frequency,
- the one or current pulse(s) may be adjustable with relatively high resolution, e.g. at least 32 steps, or 64 steps, or even more, and/or a relatively small number of pulses (for example 5 to 8) having a fixed predefined relative magnitude in powers of 2, may be selectable in each time window.

Although in the drawings (e.g. FIG. 4) it is assumed that a logic '1' is represented by a positive voltage, and a logic '0' by a zero voltage, this is pure convention, and it is of course also possible to assign a logic '1' to the zero voltage and a logic '0' to a positive voltage, as is well known in the art.

The invention claimed is:

1. A driver circuit for driving a resonant antenna-circuit, the resonant antenna-circuit comprising an inductance (L) and a capacitance (C) in parallel and being adapted for generating an oscillating voltage signal (Vosc) having a predefined oscillation frequency (fosc) over a first and second node (Na1, Na2), the driver circuit comprising:
a first and a second interface node (Ni1, Ni2) coupled to the first and second node (Na1, Na2) of the resonant antenna-circuit, respectively;
a control circuit being adapted for monitoring the oscillating voltage signal (Vosc) provided by the resonant antenna-circuit on the first and second interface node (Ni1, Ni2), and for determining a time window located in the vicinity of a local minimum and/or a local maximum of the oscillating signal and for measuring an amplitude of the oscillating voltage signal (Vosc), and for providing said time window and amplitude to an excitation circuit;
the excitation circuit being adapted for generating an excitation signal based on said time window and said amplitude, and for applying said excitation signal to the first and/or second interface node (Ni1, Ni2) and wherein the excitation circuit comprises a current source, adapted for generating at least one current pulse wherein the number of current pulses per time window and/or the amplitude and/or the duration and/or the shape of the at least one current pulse are chosen dependent on the measured amplitude of the oscillating voltage signal (Vosc).

2. A driver circuit according to claim 1, wherein the control circuit is adapted for detecting a time of occurrence of the local minimum and/or the local maximum of the oscillating voltage signal (Vosc).

3. A driver circuit according to claim 1, wherein the at least one current pulse is a single pulse having an adjustable or selectable magnitude, chosen dependent on the measured amplitude of the oscillating voltage signal (Vosc); or
wherein the at least one current pulse is a plurality (N) of at least two or at least three pulses, each having a fixed magnitude or an adjustable magnitude;
wherein the at least one current pulse is a burst comprising a plurality (N) of pulses of a predefined magnitude, the number of pulses in the burst (N) being chosen dependent on the measured amplitude of the oscillating voltage signal (Vosc).

4. A driver circuit according to claim 1, further comprising at least one voltage converter adapted for providing a positive voltage (Vp) and/or a negative voltage (Vn); and
wherein the excitation circuit is adapted for generating the excitation signal that includes pulses with a positive and/or a negative sign using said positive and/or negative voltage (Vp, Vn).

5. A driver circuit according claim 1, further comprising a damping circuit adapted for damping the oscillating voltage signal (Vosc);
and wherein the control circuit is further adapted for providing a damping control signal to said damping circuit.

6. An integrated circuit comprising one or more of the driver circuit according to claim 1.

7. A transmitter device comprising:
the driver circuit according to claim 1.

8. A transmitter device comprising:
the integrated circuit according to claim 6,
wherein said resonant antenna-circuit is a passive resonant antenna-circuit, and
wherein the integrated circuit is connected to said passive resonant antenna-circuit.

9. A method of driving a resonant antenna-circuit,
the resonant antenna-circuit having a predefined resonance frequency (fc) and comprising an inductance (L) and a capacitance (C) in parallel and being adapted for generating an oscillating voltage signal (Vosc) on a first and second node (Na1, Na2) of the resonant antenna-circuit;
the method comprising the steps of:
a) monitoring the oscillating voltage signal (Vosc) provided by the resonant antenna-circuit on the first and second node (Na1, Na2);
b) extracting timing information and amplitude information of said oscillating voltage signal (Vosc), wherein said extracting includes detecting a local minimum and/or a local maximum of said oscillating voltage signal (Vosc), and defining a time window in the vicinity of the time of occurrence of the local minimum and/or the local maximum;
c) generating an excitation signal based on the extracted timing information and based on the extracted amplitude information, and applying said excitation signal to the resonant antenna-circuit; and d) measuring an amplitude of said oscillating voltage signal (Vosc);

the method further comprising providing the excitation signal in the form of a single current pulse per time window having a duration and/or an amplitude which is adjusted as a function of the measured amplitude of the oscillating voltage signal (Vosc); or providing the excitation signal in the form of a burst comprising a number (N) of current pulses per time window having a fixed or adjustable duration and/or a fixed or adjustable amplitude and/or a fixed or adjustable sign and/or an adjustable delay between the pulses, where at least one of the number (N) or the duration or the amplitude or the sign is adjusted as a function of the measured amplitude of the oscillating voltage signal (Vosc).

10. A method of transmitting an on-off key (OOK)-modulated bitstream using a resonant antenna-circuit, the resonant antenna-circuit having a predefined resonance frequency (fc) and comprising an inductance (L) and a capacitance (C) in parallel and being adapted for generating an oscillating voltage signal (Vosc) on a first and second node (Na1, Na2) of the resonant antenna-circuit;

the method comprising the steps of:

receiving a binary bitstream;

determining a value or a transition of the bitstream;

if a value of the bitstream is detected and the value is high ('1'), driving the resonant antenna-circuit for maintaining a substantially constant amplitude of the oscillating voltage (Vosc) using the following steps for driving the resonant antenna-circuit, including:

a) monitoring the oscillating voltage signal (Vosc) provided by the resonant antenna-circuit on the first and second node (Na1, Na2);

b) extracting timing information and amplitude information of said oscillating voltage signal (Vosc), wherein said extracting includes detecting a local minimum and/or a local maximum of said oscillating voltage signal (Vosc), and defining a time window in the vicinity of the time of occurrence of the local minimum and/or the local maximum;

c) generating an excitation signal based on the extracted timing information and based on the extracted amplitude information, and applying said excitation signal to the resonant antenna-circuit;

d) measuring an amplitude of said oscillating voltage signal (Vosc); and e) providing the excitation signal in the form of:

a single current pulse per time window having a duration and/or an amplitude which is adjusted as a function of the measured amplitude of the oscillating voltage signal (Vosc); or a burst comprising a number (N) of current pulses per time window having a fixed or adjustable duration and/or a fixed or adjustable amplitude and/or a fixed or adjustable sign and/or an adjustable delay between the pulses, where at least one of the number (N) or the duration or the amplitude or the sign is adjusted as a function of the measured amplitude of the oscillating voltage signal (Vosc); and if a value of the bitstream is detected and the value is low ('0'), damping the oscillating voltage (Vosc); and if a transition is detected, and the transition is a low-to-high transition ('0'→'1') sending one or more initial excitation pulses to the resonant antenna-circuit, and subsequently driving the resonant antenna-circuit for increasing the amplitude of the oscillating voltage (Vosc) using said steps a) through e); and if a transition is detected, and the transition is a high-to-low transition ('1'→'0') damping the oscillating voltage (Vosc).

* * * * *